(12) United States Patent
Cho et al.

(10) Patent No.: US 11,038,265 B2
(45) Date of Patent: Jun. 15, 2021

(54) SEMICONDUCTOR-BASED BEAMFORMING ANTENNA

(71) Applicant: ELECTRONICS AND TELECOMMUNICATIONS RESEARCH INSTITUTE, Daejeon (KR)

(72) Inventors: Young Kyun Cho, Daejeon (KR); Cheol Ho Kim, Daejeon (KR); Bong Hyuk Park, Daejeon (KR); Kwangchun Lee, Daejeon (KR); Seok Bong Hyun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/578,203

(22) Filed: Sep. 20, 2019

(65) Prior Publication Data
US 2020/0161754 A1 May 21, 2020

(30) Foreign Application Priority Data
Nov. 16, 2018 (KR) ........................ 10-2018-0142008

(51) Int. Cl.
*H01Q 1/52* (2006.01)
*H01L 29/868* (2006.01)
(Continued)

(52) U.S. Cl.
CPC ............. *H01Q 1/523* (2013.01); *H01L 23/66* (2013.01); *H01L 29/868* (2013.01); *H01Q 3/24* (2013.01);
(Continued)

(58) Field of Classification Search
CPC .......... H01Q 1/523; H01Q 3/24; H01Q 25/00; H01Q 1/241; H01Q 3/247; H01Q 1/2283;
(Continued)

(56) References Cited

U.S. PATENT DOCUMENTS

| 2,496,643 A | * | 2/1950 | Smith | H01Q 13/06 |
| | | | | 343/776 |
| 4,571,559 A | * | 2/1986 | Henry | H01L 27/1021 |
| | | | | 257/594 |

(Continued)

FOREIGN PATENT DOCUMENTS

| KR | 20170099286 A | 8/2017 |
| KR | 20170116558 A | 10/2017 |

OTHER PUBLICATIONS

Bang, et al., "A SAR Reduced mm-Wave Beam-Steerable Array Antenna With Dual-Mode Operation for Fully Metal-Covered 5G Cellular Handsets," IEEE Antennas and Wireless Propagation Letters, 2018, vol. 17 (6), pp. 1118-1122.

(Continued)

*Primary Examiner* — Dimary S Lopez Cruz
*Assistant Examiner* — Yonchan J Kim

(57) ABSTRACT

A semiconductor-based beamforming antenna is provided. The beamforming antenna includes: a waveguide having a silicon medium formed between metal and forming a waveguide path; at least one diode array disposed in the waveguide, the at least one diode array being driven according to an applied electrical signal to reflect an incident signal by acting as a conductive reflecting wall; a radiator connected to the waveguide and radiating a beam corresponding to a signal reflected by the at least one diode array or an incident signal; and a feeder for supplying an electrical signal into the waveguide.

15 Claims, 13 Drawing Sheets

(51) Int. Cl.
  *H01Q 3/24* (2006.01)
  *H01L 23/66* (2006.01)
  *H01Q 25/00* (2006.01)
  *H01L 33/60* (2010.01)

(52) U.S. Cl.
  CPC ............ *H01Q 25/00* (2013.01); *H01L 33/60* (2013.01); *H01L 2223/6627* (2013.01); *H01L 2223/6677* (2013.01)

(58) Field of Classification Search
  CPC .......... H01L 29/868; H01L 23/66; H01L 2223/6677; H01L 2223/6627; H01L 33/60
  USPC ........................................... 257/594
  See application file for complete search history.

(56) References Cited

U.S. PATENT DOCUMENTS

| | | | |
|---|---|---|---|
| 7,079,079 B2* | 7/2006 | Jo | H01Q 1/243 343/700 MS |
| 7,109,124 B2 | 9/2006 | Harper | |
| 7,868,846 B2 | 1/2011 | Hur et al. | |
| 10,038,240 B2* | 7/2018 | Patron | H01Q 21/205 |
| 10,147,583 B2* | 12/2018 | Cho | H01J 37/147 |
| 10,170,641 B2* | 1/2019 | Kim | H01L 29/402 |
| 2017/0018400 A1 | 1/2017 | Cho et al. | |
| 2017/0294705 A1 | 10/2017 | Khripkov et al. | |
| 2019/0115651 A1* | 4/2019 | Driscoll | H01Q 21/0043 |

OTHER PUBLICATIONS

Fathy, et al., "Silicon-Based Reconfigurable Antennas-Concepts, Analysis, Implementation, and Feasibility," IEEE Transactions on Microwave Theory and Techniques, 2003, vol. 51 (6), pp. 1650-1661.

Kim, et al., "Reconfigurable Yagi-Uda Antenna Based on a Silicon Reflector with a Solid-State Plasma," Scientific Reports, 2017, vol. 7 (1), pp. 8.

Lin, et al., "A Novel Beam-Switching Array Antenna Using Series-Fed Slots With PIN Diodes," IEEE Antennas and Wireless Propagation Letters, 2017, vol. 16, pp. 1393-1396.

Sabapathy, et al., "A Ground-Plane-Truncated, Broadly Steerable Yagi-Uda Patch Array Antenna," IEEE Antennas and Wireless Propagation Letters, 2016, vol. 15, pp. 1069-1072.

Yashchyshyn, et al. "28 GHz Switched-Beam Antenna Based on S-PIN Diodes for 5G Mobile Communications," IEEE Antennas and Wireless Propagation Letters, 2018, vol. 17 (2), pp. 225-228.

Yashchyshyn, et al., "Investigation of the S-PIN Diodes for Silicon Monolithic Antennas With Reconfigurable Aperture," IEEE Transactions on Microwave Theory and Techniques, 2010, vol. 58 (5), pp. 1100-1106.

Yu, et al., "A Novel 28 GHz Beam Steering Array for 5G Mobile Device With Metallic Casing Application," IEEE Transactions on Antennas and Propagation, 2018, vol. 66 (1), pp. 462-466.

Zhai, et al., "Simulation and Structure Analysis of Reconfigurable Solid Plasma Channel Based on SPINs," Microelectronic Engineering, 2015, vol. 145, pp. 49-52.

\* cited by examiner

SEMICONDUCTOR-BASED BEAMFORMING ANTENNA

CROSS-REFERENCE TO RELATED APPLICATION

This application claims priority to and the benefit of Korean Patent Application No. 10-2018-0142008 filed in the Korean Intellectual Property Office on Nov. 16, 2018, the entire contents of which are incorporated herein by reference.

BACKGROUND OF THE INVENTION

(a) Field of the Invention

The present disclosure relates to an antenna, and more particularly, to a semiconductor-based beamforming antenna.

(b) Description of the Related Art

Recently, a paradigm transition to the 5G wireless communication system has been made in the communication network. This transition, called the era of so-called big data, demands high wireless capacity and performance for a wide range of applications that use dynamic mobile links. In order to meet these requirements, beamforming antennas such as phased array antennas are attracting attention in the millimeter wave band.

Conventional phased array antennas are capable of forming highly directional beams through reconstruction of arrays, but physical antenna size, loss, and power consumption associated with large phased array feed networks are becoming very big issues.

Semiconductor-based frequency reconfigurable antennas have been proposed to overcome the disadvantages caused by conventional metal-based phased array antennas. Frequency reconstruction at this antenna can be implemented by solid state plasma (cloud of electrons and holes), which is achieved by temporarily creating a conduction region in a channel of a silicon device in accordance with a control signal. When a switch in such an antenna is turned on, by addressing a particular pattern of the silicon device, the semiconductor can begin to behave like a metal to form the required radiation characteristics at the antenna. However, in obtaining practical and reliable beamforming characteristics, there are some problems that cannot be solved by conventional semiconductor-based frequency reconfigurable antennas.

First, although semiconductor reconstruction antennas have been developed in order to obtain reconstruction characteristics, none of these methods can construct a reconfigurable beamforming antenna based on only semiconductors. Yagi-Uda antennas and slotted waveguide antennas based on silicon PIN diodes are presented. However, because these antennas require additional metal patterns and substrates, or because most components are made of metal, the physical structure and connection state must be changed for reconstruction. Dipole antennas that show the possibility of reconstruction through frequency hopping have been proposed, but none of them are constructed of only silicon, and also none of them show beamforming characteristics.

Second, new beamforming antenna structures must be proposed to accommodate the various requirements placed on millimeter wave and sub-terahertz systems. As noted above, typical high frequency beamforming antennas have a large size, suffer high antenna losses, and further signals are combined through the substrate in a multi-beam system, resulting in a strong crosstalk effect between adjacent beam elements. Therefore, there are many difficulties in developing a beamforming antenna to meet the requirements.

Finally, most semiconductor reconstructed antennas are fabricated on silicon on insulator (SOI) wafers using surface PIN diodes, so that high power consumption is inevitable in order to obtain solid state plasma of high carrier density to cover high-conductivity areas having a skin depth of two or three times. In addition, in order to prevent wave losses through the underside of the substrate, the disadvantage of having to make the silicon thickness of the SOI wafer very thin must be overcome, and matching and loss problems caused by this must be further considered. Further, such a semiconductor reconfigured antenna requires a bias line for driving a diode, but since signal interference between the bias line and the antenna occurs, it is necessary to further develop an isolation scheme to reduce the signal interference.

The above information disclosed in this Background section is only for enhancement of understanding of the background of the disclosure and therefore it may contain information that does not form the prior art that is already known in this country to a person of ordinary skill in the art.

SUMMARY OF THE INVENTION

The present disclosure has been made in an effort to provide a beam-forming antenna capable of semiconductor-based reconstruction.

An exemplary embodiment of the present disclosure provides a beam forming antenna including: a waveguide having a silicon medium formed between metal and forming a waveguide path; at least one diode array disposed in the waveguide, the at least one diode array being driven according to an applied electrical signal to reflect an incident signal by acting as a conductive reflecting wall; a radiator connected to the waveguide and radiating a beam corresponding to a signal reflected by the at least one diode array or an incident signal; and a feeder for supplying an electrical signal into the waveguide.

In an implementation, the radiator may include a first radiator connected to one side of the waveguide and a second radiator connected to the other side opposite to the one side of the waveguide, a diode array being formed on the one side.

When the diode array is turned on, the diode array may function as a conductive reflecting wall and reflect an incident signal in the direction of the second radiator, and when the diode array is turned off, the incident signal may be propagated to the first radiator through the diode array.

In an implementation, a diode array may include a plurality of vertical PIN diodes, and each vertical PIN diode is selectively driven.

In an implementation, the vertical PIN diodes of the diode array may be arranged in a parabolic shape.

In an implementation, the vertical PIN diode may include: a P-type region formed on one surface of a silicon substrate; an N-type region formed on the other surface of the silicon substrate at a position opposite the P-type region; a contact metal formed on the P-type region and receiving an electrical signal from the outside; a bottom metal formed under the N-type region and receiving an electrical signal from the outside; and a top metal formed at a position opposite the bottom metal on an upper portion of the silicon substrate to form a wave waveguide layer with the bottom metal, and formed to overlap the contact metal while being separated from the contact metal by an insulating layer.

In an implementation, the at least one diode array may include a first diode array and a second diode array, the first diode array may be formed on one side of the waveguide, the second diode array may be formed on the other side of the waveguide opposite to the first diode array, and at least one pair of diode arrays including the first diode array and the second diode array may be formed in the waveguide.

In an implementation, the direction of the beam from the antenna may change by selectively driving the first diode array and the second diode array.

In an implementation, one among the first diode array and the second diode array may be turned on, and a beam may be radiated in a direction opposite to a direction in which a signal is incident on the turned-on diode array among the first diode array and the second diode array.

In an implementation, the radiator may include a first radiator connected to one side of the waveguide on which the first diode array is formed and a second radiator connected to the other side of the waveguide on which the second diode array is formed.

In an implementation, when the first diode array is turned on and the second diode array is turned off, the first diode array may function as a conductive reflecting wall and reflect an incident signal in the direction of the second radiator so that a beam is radiated through the second radiator, when the first diode array is turned off and the second diode array is turned on, the second diode array may function as a conductive reflecting wall and reflect an incident signal in the direction of the first radiator so that a beam is radiated through the first radiator, when the first diode array is turned off and the second diode array is turned off, the beamforming antenna may operate in an idle mode, and when the first diode array is turned on and the second diode array is turned on, beams may be radiated in both directions through the first radiator and the second radiator.

In an implementation, the beam forming antenna may further include: an impedance matching unit formed between the waveguide and the radiator; and a bias unit for applying a bias voltage to the at least one diode array, wherein the bias unit may include a plurality of bias units respectively formed on a lower end of a substrate on which the beamforming antenna is formed in directions facing each other with respect to the waveguide on the substrate.

In an implementation, the impedance matching unit may be formed of a metal pattern which is in the form of a tapered line.

In an implementation, the radiator may be formed of a metal pattern which is in the form of a meandering line.

In an implementation, the waveguide may include a microstrip line made of a metal conductor and formed on a substrate on which the beamforming antenna is formed, a bottom metal separated from the microstrip line by a silicon medium, and an inner conductor, and one diode array may be formed on one side with respect to the inner conductor, while another diode array may be formed on the other side with respect to the inner conductor.

In an implementation, a radiation angle of the beam may change according to an operating frequency band.

DETAILED DESCRIPTION OF THE EMBODIMENTS

Figure 1:
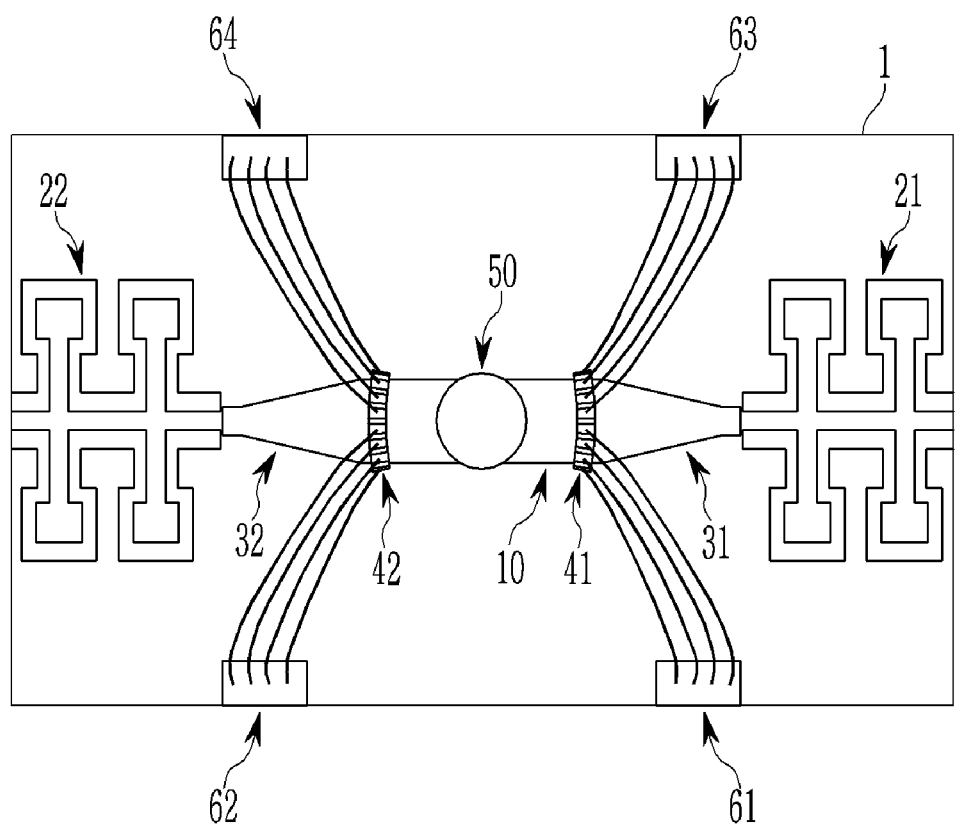
FIG. 1 is a plan view of a beamforming antenna according to an exemplary embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

In addition, terms including ordinal numbers such as "first" and "second" used in embodiments of the present disclosure may be used to describe components, but the components should not be limited by the terms. The terms are only used to distinguish one component from another. For example, without departing from the scope of the present disclosure, the first component may be referred to as the second component, and similarly, the second component may be referred to as the first component.

The expressions used in the singular herein may be interpreted in the singular or the plural, unless an explicit expression such as "one" or "single" is used.

Hereinafter, a beamforming antenna according to an embodiment of the present disclosure will be described with reference to the drawings.

FIG. 1 is a plan view of a beamforming antenna according to an exemplary embodiment of the present disclosure.

As shown in FIG. 1, the beamforming antenna 1 according to an embodiment of the present disclosure includes a waveguide 10, radiators 21 and 22 connected to the waveguide 10, impedance matching units 31 and 32 formed between the waveguide 10 and the radiators 21 and 22, diode arrays 41 and 42 formed in the waveguide 10 and functioning as conductive reflecting walls, and a feeder for supplying an electrical signal into the waveguide 10, and further includes bias units 61, 62, 63, 64 connected to the diode arrays 41 and 42.

The beamforming antenna 1 of this structure may be formed on a silicon substrate.

An embodiment of the present disclosure will be described by using an example in which a beamforming antenna steers a beam in two directions, and thus, two diode arrays are formed. However, the present disclosure is not limited thereto, and one or more diode arrays can be used.

Figure 2:
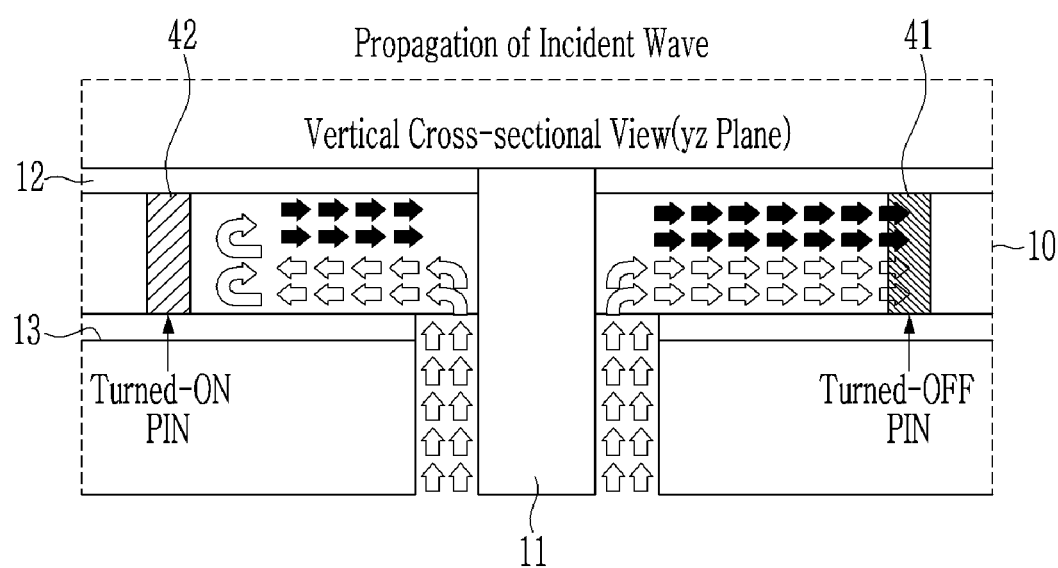
FIG. 2 is a vertical cross-sectional view of a beamforming antenna according to an embodiment of the present disclosure.
Figure 3:
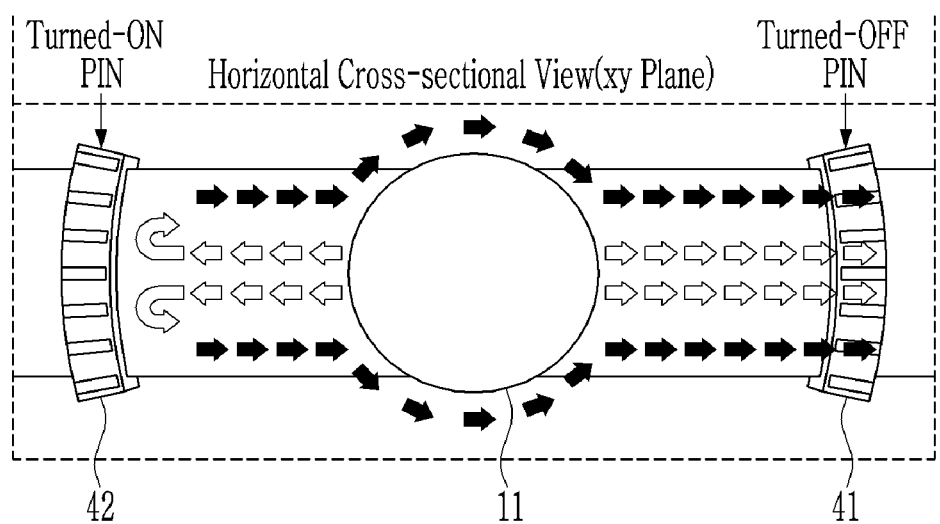
FIG. 3 is a horizontal cross-sectional view of the beamforming antenna according to the embodiment of the present disclosure.

FIG. 2 is a vertical cross-sectional view of the beamforming antenna according to an embodiment of the present disclosure, and FIG. 3 is a horizontal cross-sectional view of the beamforming antenna according to an embodiment of the present disclosure.

Referring to the structure of the beamforming antenna 1 in detail based on FIG. 2, FIG. 3, and FIG. 1, the waveguide 10 is a coaxial waveguide having an inner conductor 11 therein. The inner conductor 11 inside the waveguide 10 functions as a feed unit 50 that transmits an electrical signal to the silicon medium inside the waveguide 10.

The waveguide 10 includes a top metal 12 and a bottom metal 13, and the top metal 12 and the bottom metal 13 are separated by a silicon medium, as in FIG. 2. In the embodiment of the present disclosure, the top metal 12 is made of a microstrip line. In this example, the beamforming antenna steers the beam in two directions, so that the top metal 12 of the waveguide 10 is made of microstrip lines, but in order to form the beam in more directions, the area of the top metal 12 in the waveguide 10 may be wider for impedance matching.

One diode array 41 is formed at one side based on the inner conductor 11 inside the waveguide 10, and the other diode array 42 is formed at the other side based on the inner conductor 11. The diode arrays 41 and 42 include a plurality of PIN diodes, each of which is arranged in a parabolic shape for efficient wave reflection. However, the present disclosure is not limited thereto, and the PIN diodes constituting the diode arrays 41 and 42 may be arranged in various shapes such as a circle and a straight line to adjust the direction and the width of the beam.

The diode arrays 41 and 42 include a plurality of diodes, in particular vertical PIN diodes, each of which may be selectively driven. The diode arrays 41 and 42 are arranged perpendicular to the waveguide 10 as shown in FIG. 2 to form a conductive reflecting wall. Specifically, as shown in FIG. 3, when the diode array 42 is turned on and the other diode array 41 is turned off, an internal plasma is generated perpendicular to the silicon substrate, thereby the turned-on diode array 42 serves as a conductive reflecting wall that reflects the incident wave in the opposite direction. By this conductive reflecting wall, the incident wave signal is no longer propagated in that direction and is reflected only to the opposite side of the reflecting wall. Thus, the direction of the beam can be reconstructed by selectively turning on the diode arrays 41 and 42. This will be described in more detail later.

On the other hand, the feeder 50 is composed of the inner conductor 11 formed in the waveguide 10, and supplies an electrical signal to the inside of the waveguide 10. This also provides an electrical signal to the diode arrays 41 and 42.

The bias units 61 to 64 are connected to the diode arrays 41 and 42 to supply a bias voltage. The bias units 61 to 64 are respectively formed at the lower end of the substrate, on which the beamforming antenna is formed, in a direction facing each other with respect to the waveguide 10. Specifically, the bias units 61 and 62 are formed on one side of the substrate with respect to the waveguide 10, and the other bias units 63 and 64 are formed on the other side of the substrate. The bias units 61 and 63 are each connected to one diode array 41 through a bonding wire, and the other bias units 62 and 64 are each connected to another diode array 42 through a bonding wire. The bonding wire for applying the potential to the diode is mounted on the PCB board and mounted on both sides of the semiconductor chip for convenience, but this configuration can also be adjusted in consideration of the number of beams and the antenna characteristics.

The impedance matching units 31 and 32 formed between the waveguide 10 and the radiators 21 and 22 are formed of a metal pattern that is a tapered line, as shown in FIG. 1, for smooth impedance matching.

The radiators 21 and 22 radiate waves traveling along radio waves. In the embodiment of the present disclosure, as shown in FIG. 1, the radiators 21 and 22 are made of a metal pattern in the form of meandering lines in order to further activate the radiation of the traveling wave to increase the gain of the antenna.

Since the wave number of the traveling wave varies with frequency, the main beam is accordingly formed at an angle in the ±yz direction. Therefore, the antenna according to the embodiment of the present disclosure can achieve the characteristic that the radiation angle of the beam changes according to the operating frequency band. Here, the radiators 21 and 22 may be formed of a metal pattern on the surface of the silicon substrate, but may be formed of a semiconductor, a hybrid form, and various shapes in order to further improve the characteristics of the antenna. In addition, the shape of the impedance matching units 31 and 32 is not limited to the tapered lines, but may be designed in various forms in response to a shape change of the radiators 21 and 22.

Figure 4:
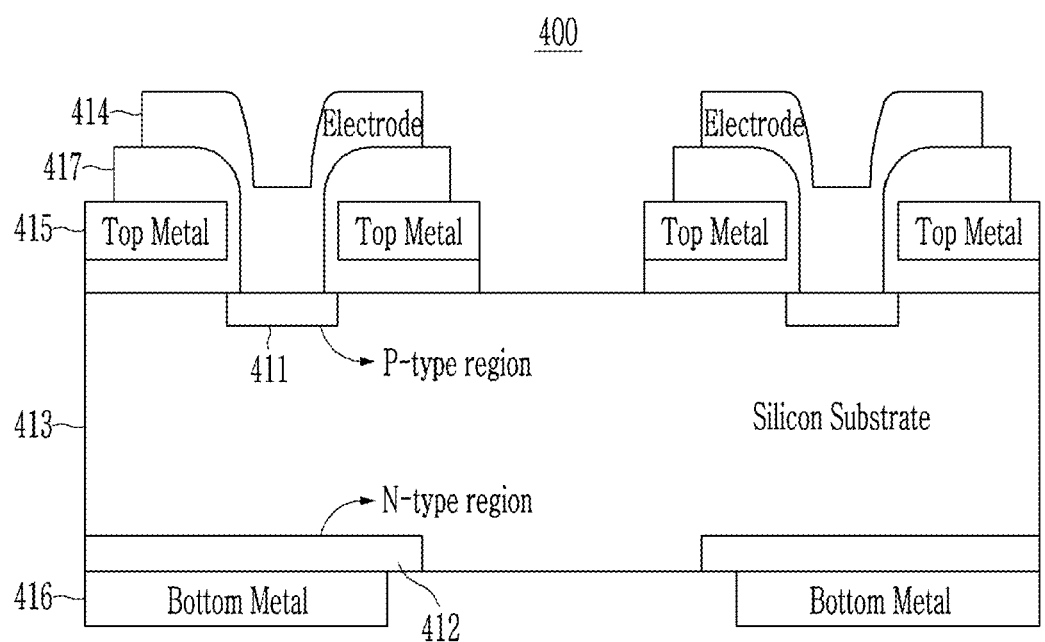
FIG. 4 is a diagram illustrating the structure of a diode constituting a diode array according to an exemplary embodiment of the present disclosure.

FIG. 4 is a diagram illustrating the structure of a diode constituting a diode array according to an exemplary embodiment of the present disclosure.

The diode constituting the diode array according to the embodiment of the present disclosure is a vertical PIN diode, and may be configured as shown in FIG. 4. Specifically, a vertical PIN diode 400 includes a silicon substrate 413 having a P-type region 411 and an N-type region 412, a contact metal 414, a top metal 415, a bottom metal 416, and an insulating layer 417.

In the vertical PIN diode 400, conductive regions, that is, the P-type region 411 and the N-type region 412, are formed of at positions opposite to each other on the upper surface and the lower surface of the silicon substrate 413, respectively. Although the P-type region 411 is shown here as being formed on the upper surface of the silicon substrate 413 and the N-type region 412 is shown as being formed on the lower surface of the silicon substrate 413, it may be reversed. In addition, the shapes of the P-type region 411 and the N-type region 412 are not limited to the rectangle as shown in FIG. 4.

The contact metal 414 is formed on the P-type region 411, and the bottom metal 416 is formed on the N-type region 412. The contact metal 414 and the bottom metal 416 are in physical contact with or are electrically connected to the P-type region 411 and the N-type region 412, such that the P-type region 411 and the N-type region 412 are each electrically connected to the outside, such as to a power source.

In addition, the top metal 415 and the bottom metal 416 function as a waveguide wave layer for guiding radio waves such as reflected waves in a specific direction. The insulating layer 417 is formed to insulate and physically protect the top metal 415 forming the waveguide layer from the conductive components (e.g., the contact metal 414). The insulating layer 417 is formed of an organic material or an electrically insulating material such as a nitride.

Specifically, for the vertical PIN diode 400 of this structure, N-type junction doping is performed on the bottom surface of the silicon substrate 413, and the bottom metal 416 serving as the ground is formed. P-type junction doping is performed on the top surface of the silicon substrate 413, and the contact metal 414 and the top metal 415 are formed.

In the structure of the diode 400, the waveguide configuration is made through the waveguide layer of the top metal 415 and the bottom metal 416, and the contact metal 414 for applying a bias voltage is formed in the upper part of the top metal 415. When the contact metal 414 is lower than the metal (the top metal 415) constituting the waveguide, the contact metal 414 affects radio waves traveling in the silicon medium. In an embodiment of the present disclosure, a double-layered metal structure is utilized to prevent bias lines from affecting the radio waves traveling in the silicon medium. In addition, the formation of the metal in a double-layered structure may cause additional loss since the radio waves traveling in the silicon medium exit through the space between the top metal 415 and the contact metal 414. This may be resolved by appropriately overlapping the contact metal 414 and the top metal 415. The larger the interval where the contact metal 414 and the top metal 415 overlap, the more advantageous for alleviating the loss of the radio waves.

The vertical PIN diodes with this structure create a more robust conductive wall than horizontal PIN diodes, allowing the antenna to be configured with relatively high power efficiency. In addition, the vertical PIN diode according to an embodiment of the present disclosure may provide a bias line without signal interference by routing a DC supply path over the waveguide layer.

In addition, the fabrication of a vertical plasma-based semiconductor reconstruction antenna can be implemented through a silicon wafer-based CMOS process, thereby providing low-cost mass production and high integration compared to using an SOI wafer.

In an embodiment of the present disclosure, a semiconductor antenna using a silicon substrate has been described, the silicon substrate may be manufactured using a compound substrate (GaAs, GaN, InP, InGaP, etc.), and the diode may be manufactured through a corresponding material.

Figure 5:
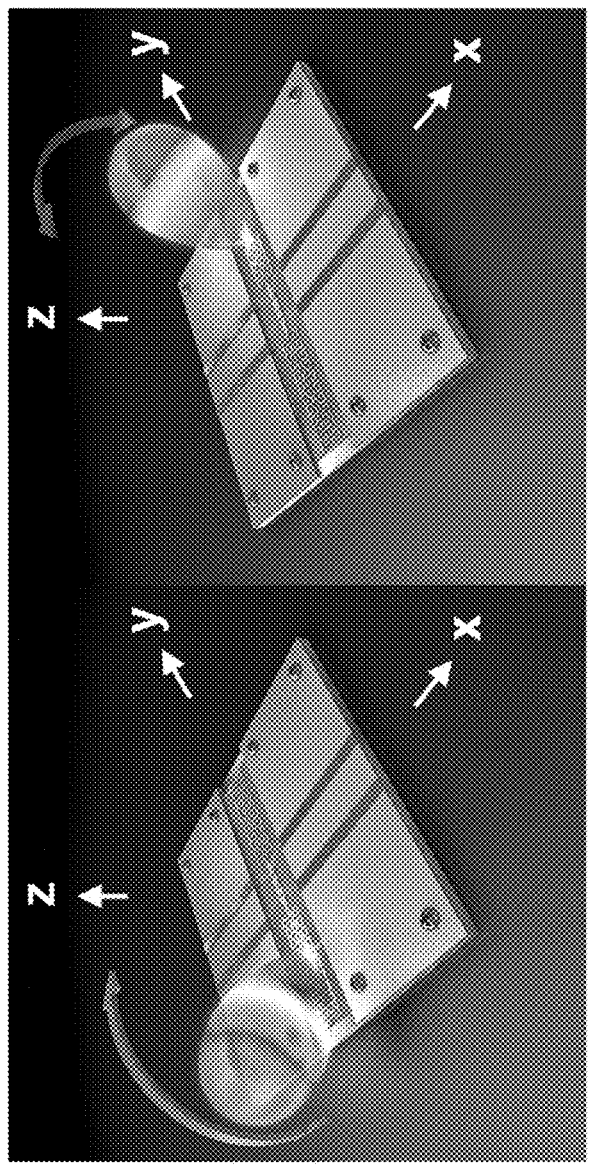
FIG. 5 is a perspective view of a beamforming antenna according to an embodiment of the present disclosure.

FIG. 5 is a perspective view of a beamforming antenna according to an embodiment of the present disclosure.

As shown in FIG. 5, the beamforming antenna according to the embodiment of the present disclosure may fully integrate all antenna components such as waveguides, reconstructing reflectors, impedance matching units, and radiators. Through this structure, since the antenna according to the embodiment of the present disclosure is small in size and low in loss, it is possible to easily configure the beamforming antenna in the millimeter wave and sub-terahertz regions.

In particular, the beamforming antenna according to the embodiment of the present disclosure can steer beams in different directions as shown in FIG. 5, and can adjust the angles of the beams according to a frequency.

Next, an operation of the beamforming antenna according to the embodiment of the present disclosure will be described.

When the incident wave signal travels within the silicon medium and encounters a conductive reflecting wall made of silicon plasma, the incident wave signal is no longer propagated in that direction and is reflected only to the opposite side of the conductive reflective wall. In the embodiment of the present disclosure, the conductive reflecting wall is formed using the diode arrays 41 and 42, and the direction of the beam is reconfigured according to the selective driving of the diode arrays 41 and 42. Such diode arrays 41 and 42 may be referred to as reflectors or reconfigurable reflectors.

In order to perform the beamforming function in the high frequency band through the semiconductor antenna, the beamforming antenna according to the embodiment of the present disclosure has a traveling wave structure. The traveling wave structure can improve the large size, complex matching network, various beamforming components, and high insertion loss characteristics of typical phased-array antennas.

Referring to FIGS. 2 and 3, the waveguide path is formed by the waveguide 10 in which the upper and lower portions of the silicon medium are covered with metal, and the diode arrays 41 and 42 are vertically disposed to form a conductive reflecting wall.

The incident wave signal is excited to silicon through the lower open window. When the incident wave signal travels within the silicon medium of the waveguide 10 and encounters a conductive reflecting wall made of silicon plasma, that is, the diode arrays 41 and 42, the incident wave signal is no longer propagated in that direction and is reflected only to the opposite side of the conductive reflective wall. Thus the direction of the beam can be reconstructed by selectively turning on the diode arrays 41 and 42. When the radio waves reflected by the diode arrays 41 and 42 functioning as the conductive reflecting walls are incident on the radiators 21 and 22, the vector component in the yz direction of the radiation wave is changed according to the frequency, so that the main beam of the antenna is formed at various angles. Therefore, the antenna proposed in the embodiment of the present disclosure can obtain wide angle beamforming characteristics in the yz plane.

More specifically, as shown in FIGS. 2 and 3, when the diode array 42 on one side is turned on by the bias voltage and the diode array 41 on the other side is turned off, internal plasma is generated perpendicular to the silicon substrate. The turned-on diode array 42 functions as a conductive reflecting wall that is a reflector, and reflects the incident wave in the opposite direction. At this time, the diode array 42 is disposed so that the reflected signal (a reflected wave signal) can constructively interfere with the incident wave signal traveling in the opposite direction of the reflector.

Therefore, only the radiator 21 on the opposite side of the turned-on diode array 42 is strongly excited so that the incident wave forms the main beam in that direction. The turned-off diode array 41 has as low electrical conductivity as that of the silicon substrate and thus does not affect the propagation of the radio waves.

Unlike the above, when the diode array 41 is turned on by the bias voltage and the other diode array 42 is turned off, the conductive reflecting wall causes the turned-on diode array 41 to reflect the incident wave in the opposite direction. In operation, only the radiator 22 on the opposite side of the turned-on diode array 41 is strongly excited so that the incident wave forms a main beam in that direction.

On the other hand, if both diode arrays 41 and 42 are turned on at the same time, the diode arrays 41 and 42 both function as conductive reflecting walls. Thus, the wave signal is trapped inside the waveguide, so that the antenna operates in an idle mode in which very weak radiation characteristics for all frequency bands appear.

In addition, when both diode arrays 41 and 42 are turned off at the same time, the antenna operates in a bidirectional beam mode, and the incident wave signals are equally distributed in two opposite directions, so that the radiators 21 and 22 are both strongly excited. As a result, the incident wave forms a main beam in directions corresponding to the radiators 21 and 22, respectively. Accordingly, a symmetrical beam pattern is formed by the two radiators 21 and 22.

As described above, in the exemplary embodiment of the present disclosure, the conductive reflecting walls are formed using the diode arrays 41 and 42, and the beam direction may be reconfigured by selective driving of the diode arrays 41 and 42.

On the other hand, when the radio wave reflected by the diode arrays 41 and 42 serving as the conductive reflecting walls is incident on the radiators 21 and 22, the vector component in the yz direction of the radiation wave is changed according to the frequency, so that the main beam of the antenna is formed at various angles. Therefore, the antenna according to the embodiment of the present disclosure can obtain a wide angle beamforming characteristic in the yz plane.

As mentioned above, in the embodiment of the present disclosure, the configuration of the diode array and the electrical conductivity of the diode are the very important design variables in the semiconductor-based beamforming antenna.

Figure 6:
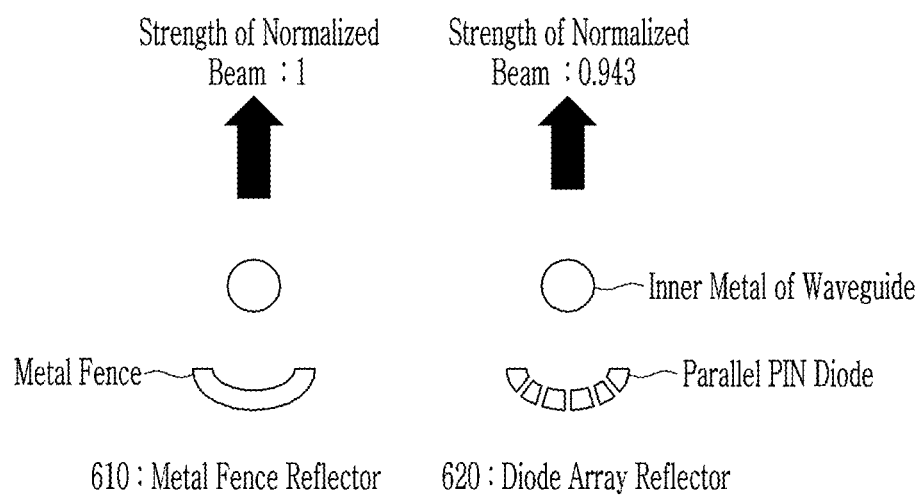
FIG. 6 is an exemplary view illustrating electric field distribution results of a metal reflector and a diode array reflector.

FIG. 6 is an exemplary view showing electric field distribution results of a metal reflector and a diode array reflector.

Assuming that only a unidirectional beam is formed through the metal reflector, as shown in 610 of FIG. 6, the position and shape of the metal fence is set so that the reflector can induce the most effective reflection and constructive interference in the opposite direction, and good impedance matching can be derived for the structure of the feed unit.

In the embodiment of the present disclosure, a diode array is used instead of the metal reflector as shown in 620 of FIG. 6 for the semiconductor-based reconfigurable beamforming antenna. The diode array can consist of a parallel connection of small diodes divided into blocks rather than a single diode.

This discrete arrangement can reduce the power consumption of the diode array while maintaining effective propagation reflectivity, because the conductive fences parallel to the electric field can be arranged in close proximity to each other to create a strong reflecting wall like a conductor plate.

Referring to the electric field distribution results of the metal reflector and the diode array reflector of FIG. 6, although the electrical conductivity of the semiconductor is only 2000 S/m, it can be seen that the difference between the maximum values of the electric field concentrated in the opposite direction through the two reflectors is only a small difference of about 5.7%.

Figure 7A:
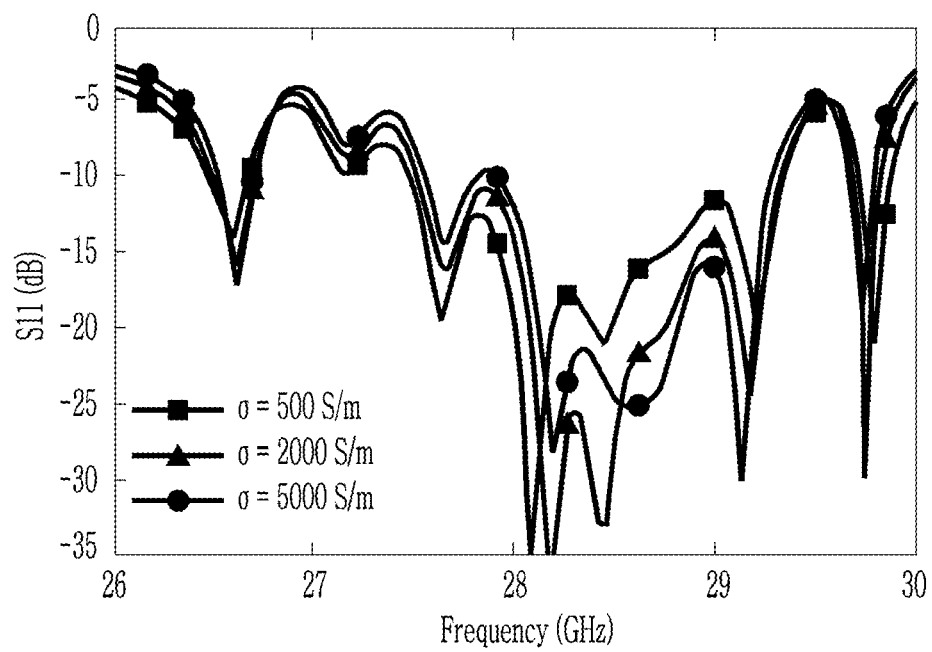
FIGS. 7A and 7B are graphs illustrating the effect of electrical conductivity in the beamforming antenna according to an embodiment of the present disclosure.
Figure 7B:
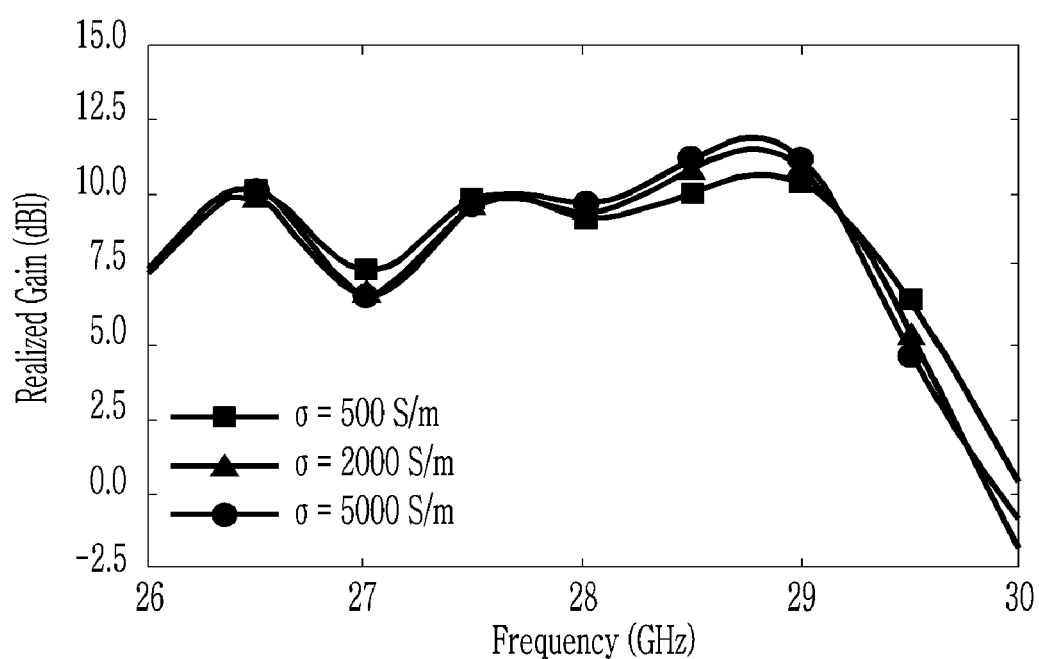

FIGS. 7A and 7B are graphs showing the effect of electrical conductivity in the beamforming antenna according to an embodiment of the present disclosure.

Specifically, a graph showing the effect of the electrical conductivity of the diode array on the input impedance matching S11 is shown in FIG. 7A, and a graph showing the effect of the electrical conductivity of the diode array on the realized gain of the antenna is shown in FIG. 7B.

Higher conductivity of the diode array shows better matching and gain characteristics, but the beamforming antenna according to the embodiment of the present disclosure does not require a high level of electrical conductivity through the waveguide type of antenna structure and the vertically arranged diode reflector. For example, in order to operate a conventional semiconductor antenna without deterioration of performance, a diode needs to have a high electrical conductivity of $10^4$ to $10^5$ S/m. However, in the beamforming antenna according to the embodiment of the present disclosure, it can be seen that appropriate performance is shown even at a low electrical conductivity of 500 S/m. Therefore, the beamforming antenna according to the embodiment of the present disclosure can perform a power-efficient operation with low thermal radiation characteristics of the diode.

Figure 8:
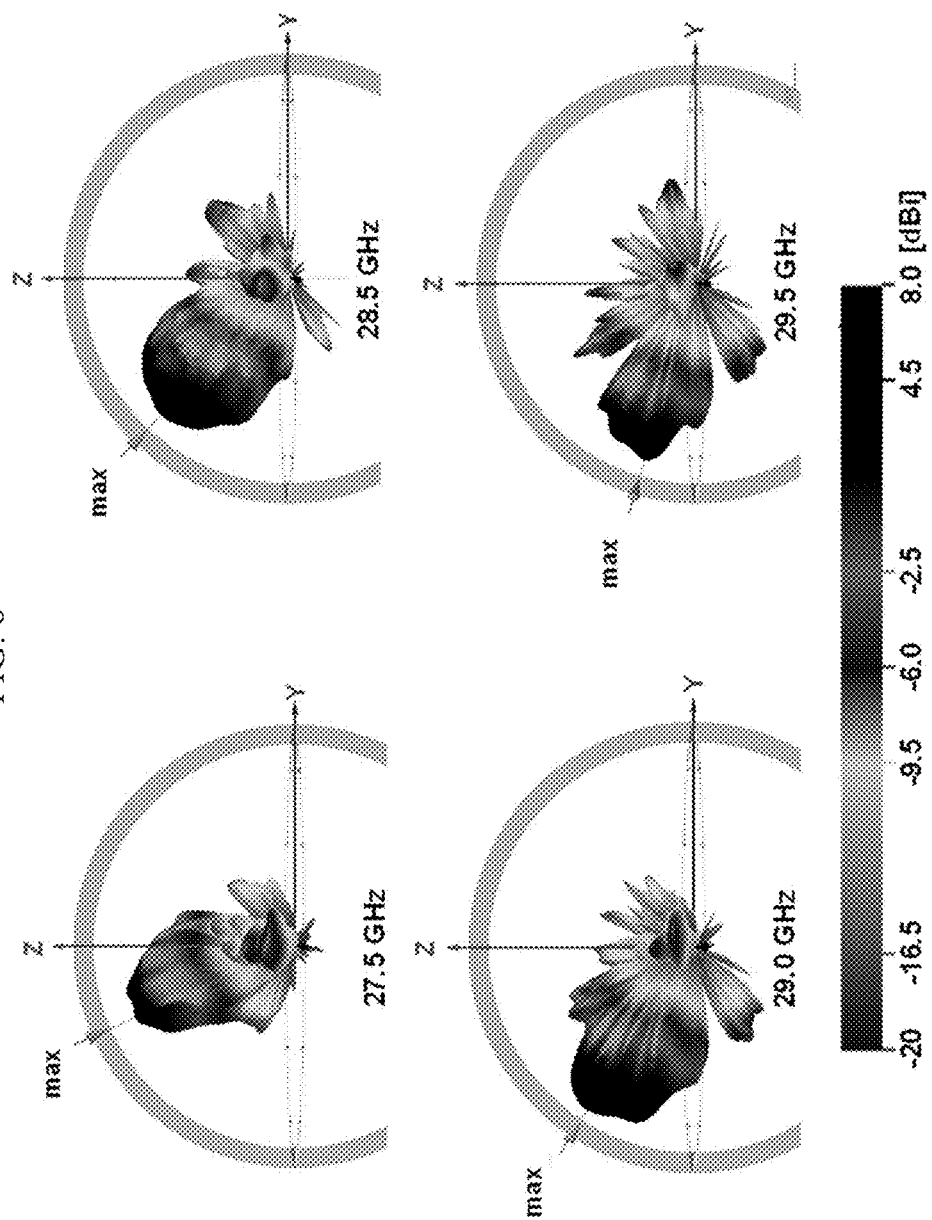
FIG. 8 is a diagram illustrating a 3D beam pattern measurement result of a beamforming antenna according to an exemplary embodiment of the present disclosure.
Figure 9A:
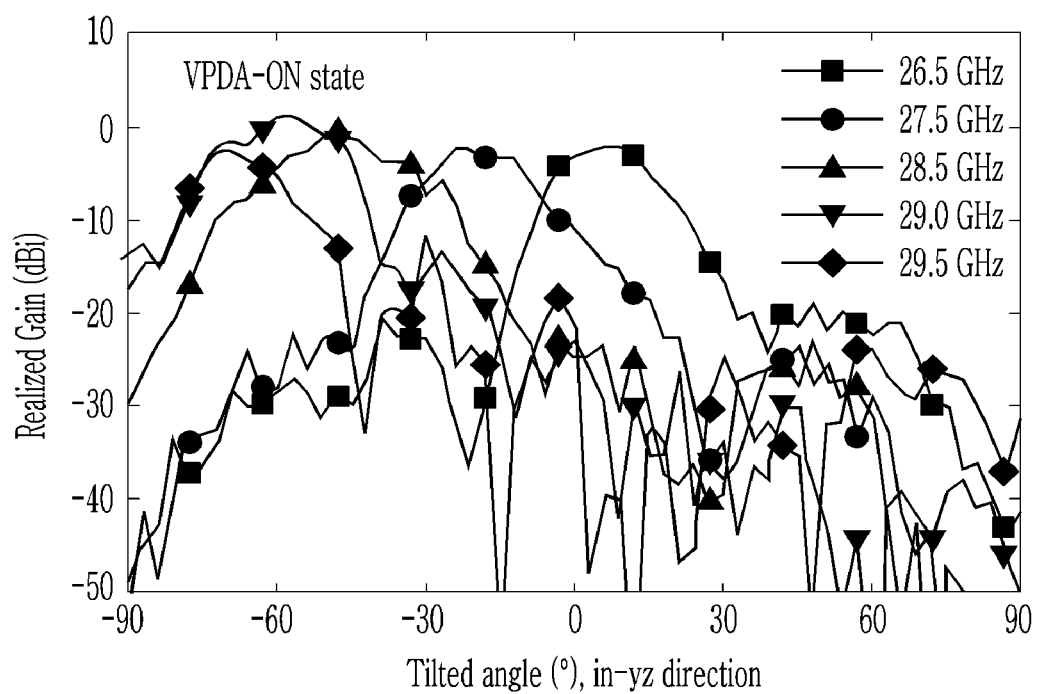
FIGS. 9A, 9B, 10A and 10B illustrate gain and radiation angles measured depending on an operation mode of a beamforming antenna according to an exemplary embodiment of the present disclosure.
Figure 9B:
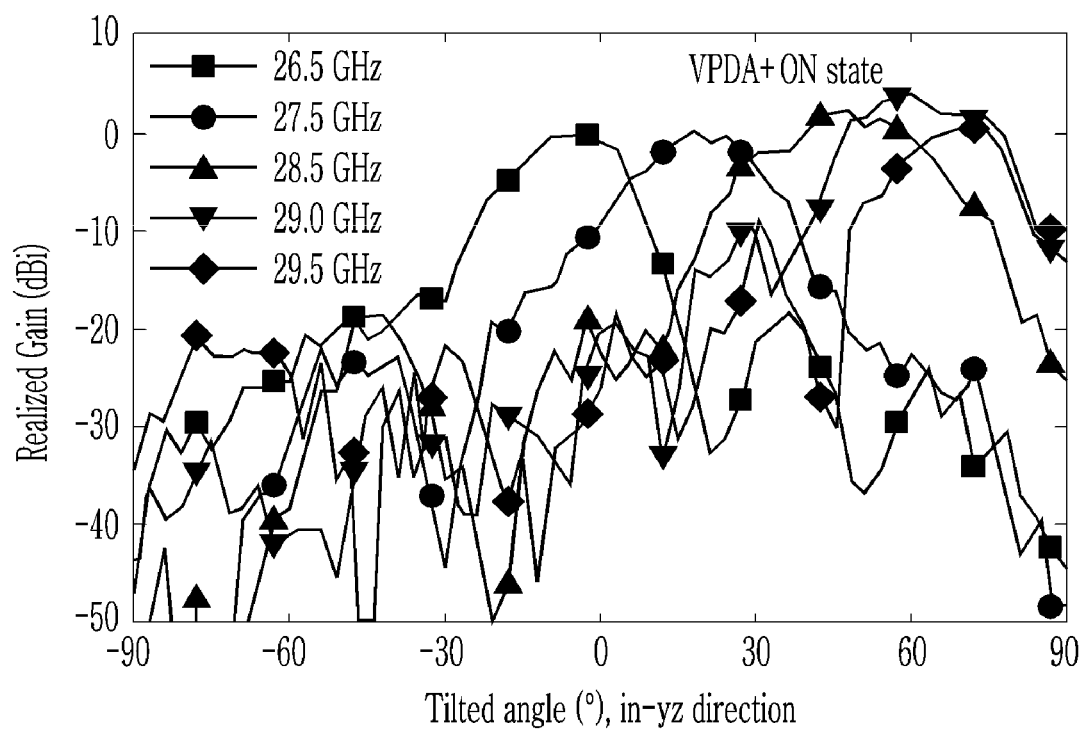

FIG. 8 is a diagram illustrating a 3D beam pattern measurement result of a beamforming antenna according to an exemplary embodiment of the present disclosure.

Only concepts of semiconductor antennas have been proposed, and there is no exact description of the actual antenna structure. However, in order to obtain the characteristics by applying semiconductor elements to the antenna, the structure of the antenna must be designed correctly so that the performance such as gain and frequency can be accurately obtained, and thus it is possible to determine whether the beam forming is properly performed. Accordingly, in the case of constituting the antenna through a semiconductor, the structure of the antenna should be presented to implement the concept.

As described above, an embodiment of the present disclosure provides a semiconductor-based beamforming antenna having a specific structure, and has excellent beam pattern performance as shown in FIG. 8.

FIG. 8 illustrates a measurement result of only one diode array excited in a beamforming antenna according to an exemplary embodiment of the present disclosure.

In FIG. 8, it can be seen that the beam pattern is formed in the opposite direction of the turned reflector.

In addition, it can be seen that the radiation angle of the beam changes is changed according to a frequency.

Specifically, if the antenna according to the embodiment of the present disclosure has a maximum gain of 7.2 dBi in the operating frequency band of 29 GHz, the radiation angle is about 61 degrees. In addition, while having a constant gain characteristic of 5 dBi or more in the frequency band of 29.6 GHz, the radiation angle has a characteristic of 16~74 degrees. Therefore, it can be seen that beam forming can be easily performed without a complicated beamforming network and an array antenna.

In addition, it can be seen that the antenna according to the embodiment of the present disclosure exhibits excellent back and side lobe characteristics compared to a conventional phased array antenna.

FIGS. 9A, 9B, 10A and 10B illustrate gain and radiation angles measured depending on an operation mode of a beamforming antenna according to an exemplary embodiment of the present disclosure.

In order to verify the feasibility of the beamforming antenna according to an embodiment of the present disclosure, a structure in which a diode array functioning as a reflector is disposed respectively in two directions is used, but the present disclosure is not limited thereto. Depending on the application and the way it is used, the diode arrays can be arranged in various forms to allow the antenna to operate in more different modes.

First, when the antenna according to the embodiment of the present disclosure operates in a single beam mode in which only one diode array of both diode arrays is turned on (shown in FIGS. 9A and 9B), it can be seen that the beam scanning range is changing to 0~75 degrees for an operating frequency of 26.5 GHz to 29.5 GHz. Thus, it can be seen that the main beam direction is easily switched depending on which diode array is activated in the beamforming antenna according to an embodiment of the present disclosure.

Figure 10A:
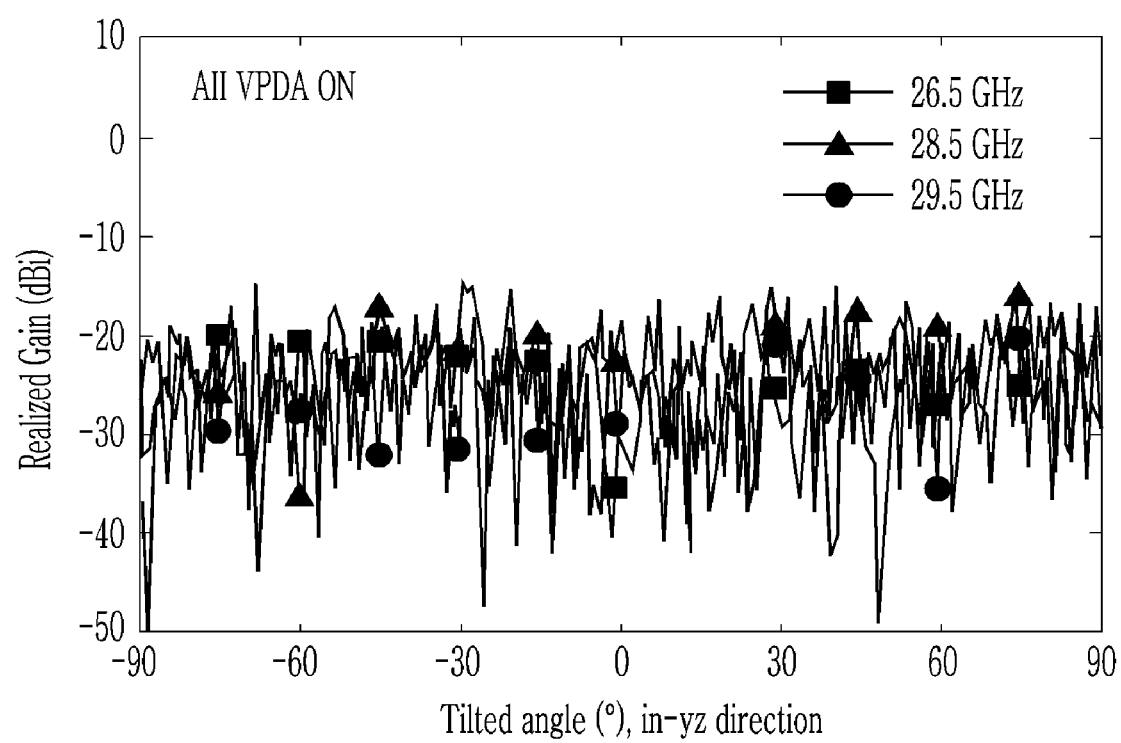

If both diode arrays are turned on at the same time in the beamforming antenna according to the embodiment of the present disclosure, the antenna operates in the idle mode. In this case, since the diode arrays both operate as reflectors, the wave signals are trapped inside the waveguide, so that the antenna exhibits very weak radiation characteristics for all frequency bands as shown in FIG. 10A. These results support the fact that a turned-on diode array is an effective reflecting wall.

Figure 10B:
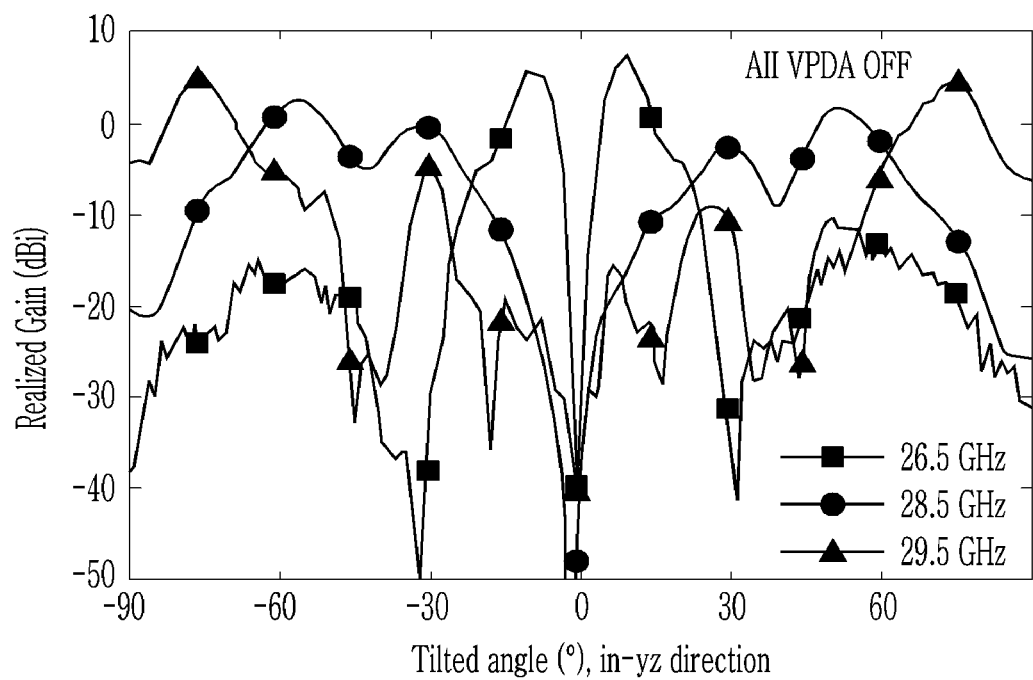

In the beamforming antenna according to an embodiment of the present disclosure, when both diode arrays are turned off at the same time, the antenna operates in a bidirectional beam mode. In the bidirectional beam mode, both diode arrays are turned off, as shown in FIG. 10B, so that the input signal is equally distributed in two opposite directions and the two radiators are simultaneously excited to form a symmetrical beam pattern.

In the above embodiments of the present disclosure, the antenna operating in four modes using two diode arrays is described in order to facilitate the description. However, the present disclosure is not limited thereto, and the present disclosure may be extended to multiple modes by expanding the configuration of diode arrays. For example, an antenna operating in 16 modes can be configured using four diode arrays.

Through this, it is possible to implement an antenna for converting the main beam in various directions, and the beamforming antenna according to the embodiment of the present disclosure will be an excellent solution for many other beam steering or beam forming applications.

According to an embodiment of the present disclosure, a semiconductor-based beamforming antenna having a specific structure capable of reconfiguring frequencies while using a semiconductor element may be provided.

In addition, it is possible to provide an antenna having a semiconductor-based traveling wave structure, in which an input signal is confined through a wave guide metal so that the signal can be effectively moved within a silicon medium.

Therefore, the total loss of the antenna can be minimized.

Further, in the embodiment of the present disclosure, by selectively turning a diode array serving as a conductive reflecting wall on/off, the conductive reflecting wall composed of the silicon plasma is selectively formed while the incident wave travels in the silicon medium. Accordingly, the direction and tilt angle of the beam can be reconstructed.

Although the embodiments of the present disclosure have been described in detail above, the scope of the present disclosure is not limited thereto, and various modifications and improvements by those skilled in the art using the basic concepts of the present disclosure defined in the following claims are also provided, and they also belong to the scope of rights.

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

What is claimed is:

1. A beam forming antenna, comprising:
a waveguide having a silicon medium formed between a top metal and a bottom metal and forming a waveguide path;
at least one diode array disposed between the top metal and the bottom metal of the waveguide, the at least one diode array being driven according to an applied electrical signal to reflect an incident signal by acting as a conductive reflecting wall;
a radiator connected to the waveguide and radiating a beam corresponding to a signal reflected by the at least one diode array and the incident signal;
and a feeder for supplying an electrical signal into the waveguide,
wherein the at least one diode array is configured so that when the at least one diode array is turned on, the at least one diode array functions as a conductive reflecting wall and then the incident signal is reflected by the at least one diode array, and when the at least one diode array is turned off, the incident signal is propagated through the at least one diode array.

2. The beam forming antenna of claim 1, wherein the radiator includes a first radiator connected to one side of the waveguide and a second radiator connected to the other side opposite to the one side of the waveguide, a first diode array being formed on the one side,
wherein when the first diode array is turned on, the first diode array functions as a conductive reflecting wall and reflects a first incident signal in the direction of the second radiator, and when the first diode array is turned off, the first incident signal is propagated to the first radiator through the first diode array.

3. The beam forming antenna of claim 1, wherein the at least one diode array comprises a plurality of vertical PIN diodes, and each vertical PIN diode is selectively driven.

4. The beam forming antenna of claim 3, wherein the vertical PIN diodes of the at least one diode array are arranged in a parabolic shape.

5. The beam forming antenna of claim 3, wherein the vertical PIN diode comprises:
a P-type region formed on one surface of a silicon substrate;
an N-type region formed on the other surface of the silicon substrate at a position opposite the P-type region;
a contact metal formed on the P-type region and receiving an electrical signal from the outside;
a bottom metal formed under the N-type region and receiving an electrical signal from the outside; and
a top metal formed at a position opposite the bottom metal on an upper portion of the silicon substrate to form a waveguide layer with the bottom metal, and formed to overlap the contact metal while being separated from the contact metal by an insulating layer.

6. The beam forming antenna of claim 1, wherein the at least one diode array comprises a first diode array and a second diode array, the first diode array is formed on one side of the waveguide, the second diode array is formed on the other side of the waveguide opposite to the first diode array, and at least one pair of diode arrays including the first diode array and the second diode array are formed in the waveguide.

7. The beam forming antenna of claim 6, wherein the direction of the beam from the beam forming antenna changes by selectively driving the first diode array and the second diode array.

8. The beam forming antenna of claim 7, wherein
one among the first diode array and the second diode array is turned on and a beam is radiated in a direction opposite to a direction in which a signal is incident on the turned on diode array among the first diode array and the second diode array.

9. The beam forming antenna of claim 6, wherein the radiator includes a first radiator connected to one side of the waveguide on which the first diode array is formed and a second radiator connected to the other side of the waveguide on which the second diode array is formed.

10. The beam forming antenna of claim 9, wherein
when the first diode array is turned on and the second diode array is turned off, the first diode array functions as a conductive reflecting wall and reflects an incident signal in the direction of the second radiator so that a beam is radiated through the second radiator,
when the first diode array is turned off and the second diode array is turned on, the second diode array functions as a conductive reflecting wall and reflects an incident signal in the direction of the first radiator so that a beam is radiated through the first radiator,
when the first diode array is turned off and the second diode array is turned off, beams are radiated in both directions through the first radiator and the second radiator, and
when the first diode array is turned on and the second diode array is turned on, the beamforming antenna operates in an idle mode.

11. The beam forming antenna of claim 1, further comprising:
an impedance matching unit formed between the waveguide and the radiator; and
a bias unit for applying a bias voltage to the at least one diode array,
wherein the bias unit includes a plurality of bias units respectively formed, on a lower end of a substrate, on which the beamforming antenna is formed in directions facing each other with respect to the waveguide on the substrate.

12. The beam forming antenna of claim 11, wherein the impedance matching unit is formed of a metal pattern which is in the form of a tapered line.

13. The beam forming antenna of claim 1, wherein the radiator is formed of a metal pattern which is in the form of a meandering line.

14. The beam forming antenna of claim 1, wherein the waveguide comprises a microstrip line made of a metal conductor and formed on a substrate on which the beamforming antenna is formed, a bottom metal separated from the microstrip line by a silicon medium, and an inner conductor, and
one diode array is formed on one side with respect to the inner conductor, while another diode array is formed on the other side with respect to the inner conductor.

15. The beam forming antenna of claim 1, wherein a radiation angle of the beam changes according to an operating frequency band.

* * * * *